(12) United States Patent
Lin et al.

(10) Patent No.: US 12,238,937 B2
(45) Date of Patent: Feb. 25, 2025

(54) MAGNETIC TUNNEL JUNCTION STRUCTURES AND RELATED METHODS

(71) Applicant: Taiwan Semiconductor Manufacturing Co., Ltd., Hsinchu (TW)

(72) Inventors: Shy-Jay Lin, Hsinchu (TW); Mingyuan Song, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 134 days.

(21) Appl. No.: 17/870,695

(22) Filed: Jul. 21, 2022

(65) Prior Publication Data

US 2022/0359614 A1    Nov. 10, 2022

Related U.S. Application Data

(62) Division of application No. 16/438,193, filed on Jun. 11, 2019, now Pat. No. 11,594,575.

(60) Provisional application No. 62/725,620, filed on Aug. 31, 2018.

(51) Int. Cl.
*H01L 43/04* (2006.01)
*H10B 61/00* (2023.01)
*H10N 50/80* (2023.01)
*H10N 50/85* (2023.01)

(52) U.S. Cl.
CPC .............. *H10B 61/22* (2023.02); *H10N 50/80* (2023.02); *H10N 50/85* (2023.02)

(58) Field of Classification Search
None
See application file for complete search history.

(56) References Cited

U.S. PATENT DOCUMENTS

| | | |
|---|---|---|
| 2018/0040811 A1 | 2/2018 | Lee et al. |
| 2018/0166197 A1 | 6/2018 | Wang et al. |
| 2019/0386205 A1 | 12/2019 | Gosavi et al. |

*Primary Examiner* — Joseph C. Nicely
*Assistant Examiner* — Lamont B Koo
(74) *Attorney, Agent, or Firm* — Seed IP Law Group LLP

(57) ABSTRACT

The disclosure is directed to spin-orbit torque ("SOT") magnetoresistive random-access memory ("MRAM") ("SOT-MRAM") structures and methods. A new structure of the SOT channel has one or more magnetic insertion layers superposed or stacked with one or more heavy metal layer(s). Through proximity to a magnetic insertion layer, a surface portion of a heavy metal layer is magnetized to include a magnetization. The magnetization within the heavy metal layer enhances spin-dependent scattering, which leads to increased transverse spin imbalance.

20 Claims, 13 Drawing Sheets

MAGNETIC TUNNEL JUNCTION STRUCTURES AND RELATED METHODS

BACKGROUND

Magnetoresistive random-access memory ("MRAM") is a promising non-volatile data storage technology. The core of a MRAM storage cell (or "bit") is a magnetic tunnel junction ("MTJ") in which a dielectric layer is sandwiched between a magnetic fixed layer ("reference layer") and a magnetic free layer ("free layer") whose magnetization polarity can be changed. Due to the tunnel magnetoresistance effect, the resistance value between the reference layer and the free layer changes with the magnetization polarity switch in the free layer. Parallel magnetizations ("P state") lead to a lower electric resistance, whereas antiparallel magnetizations ("AP state") lead to a higher electric resistance. The two states of the resistance values are considered as two logic states "1" or "0" that are stored in the MRAM cell.

In a spin transfer torque ("STT") MRAM ("STT-MRAM") cell, the write current is applied passing through the entire MTJ, i.e., reference layer, the dielectric layer, and the free layer, which sets the magnetization polarity of the free layer through the spin transfer torque effect. That is, the write current passes through a same path as the read path of the MRAM. In a spin-orbit torque ("SOT") MRAM ("SOT-MRAM") cell, a MTJ structure is positioned on a heavy metal layer with large spin-orbit interaction. The free layer is in direct contact with the heavy metal layer. Spin torque is induced by the in-plane current injected through the heavy metal layer under the spin-orbit coupling effect, which generally includes one or more of the Rashba effect or the spin Hall effect ("SHE effect"). The write current does not pass through the vertical MTJ. Instead, the write current passes through the heavy metal layer in an in-plane direction. The magnetization polarity in the free layer is set through the SOT effect. More specifically, when a current is injected in-plane in the heavy metal layer, the spin orbit coupling leads to an orthogonal spin current which creates a spin torque and induce magnetization reversal in the free layer.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

DETAILED DESCRIPTION

Figure 1:
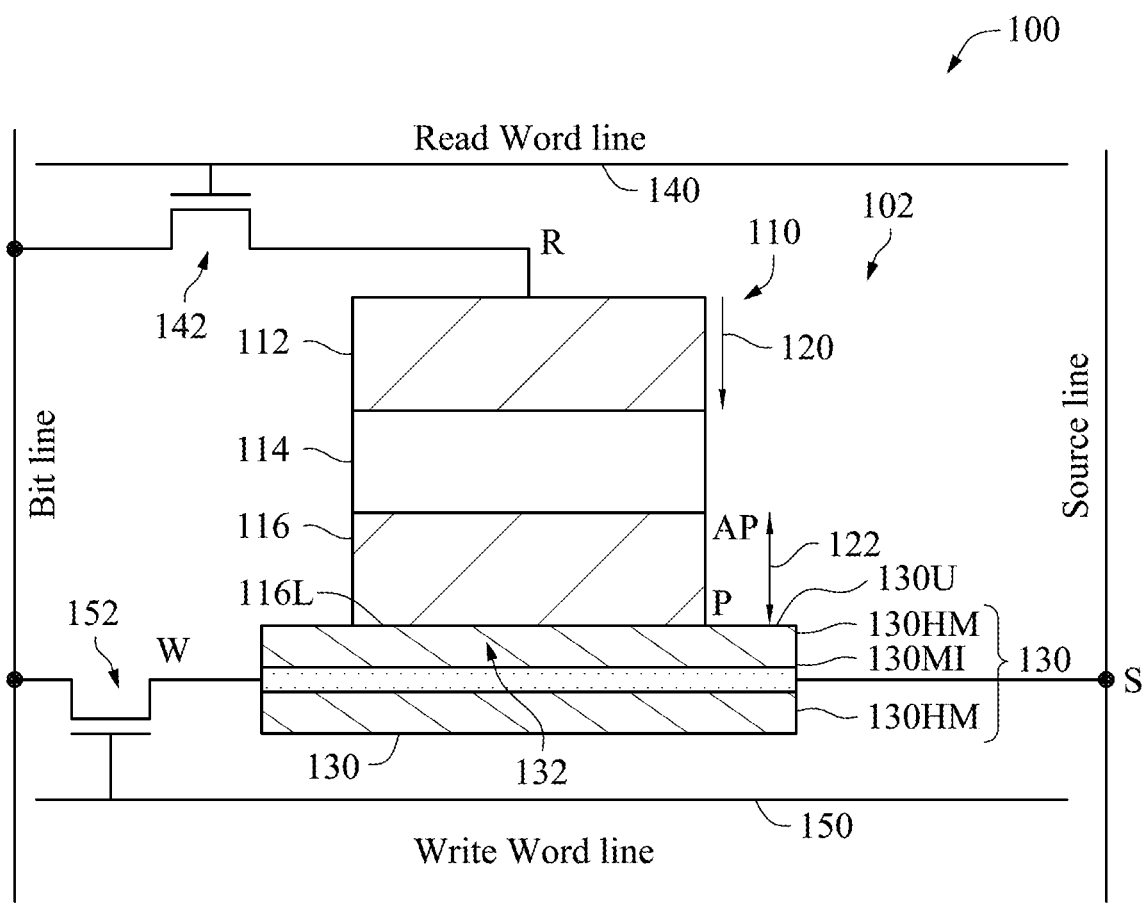
FIG. 1 is an example SOT-MRAM cell.

In the SOT-MRAM system design, it is preferred that a lower switching current flows through the SOT channel layer, which switches the magnetization state of the perpendicular MTJ ("pMTJ") with a higher spin HALL efficiency. The disclosed techniques are directed to a new structure of the SOT channel that has one or more magnetic insertion layers superposed or stacked with one or more heavy metal layer(s). Through proximity to a magnetic insertion layer, a surface portion of a heavy metal layer is magnetized to include a magnetization. The magnetization within the heavy metal layer enhances spin-dependent scattering, which leads to increased transverse spin imbalance. Resultantly, more spins are accumulated at the boundaries of the heavy metal layer, which generates stronger magnetic torques in the free layer of the pMTJ. In other words, the magnetic insertion layer improves the conversion rate from an in-plane current flowing through the SOT channel to a magnetic torque on the magnetization of the free layer of the pMTJ.

The magnetic insertion layer may have in-plane magnetic anisotropy or perpendicular magnetic anisotropy. The material of the magnetic insertion layer is selected such that the crystalline lattice of the magnetic insertion layer will not impact the adjacent heavy metal layer or the free layer of the pMTJ, and vice versa. The lattice matching or mismatching between the magnetic insertion layer and one or more of the heavy metal layer or the free layer of the pMTJ are determined based on the size and shape of the crystalline lattices thereof. The choice of the magnetic insertion layer material also depends on the magnetic anisotropy of the magnetic insertion layer. For example cobalt/platinum Co/Pt multilayer or cobalt/nickel Co/Ni multilayer may be used as perpendicular magnetic anisotropy ("PMA") insertion layer(s). CoFeB magnetic alloy or permalloy (nickel-iron magnetic alloy) may be used as in-plane magnetic anisotropy ("IMA") insertion layers.

With respect to a magnetic insertion layer of PMA, the overall thickness of the magnetic insertion layer or layers is controlled to be relatively thin, as compared to the free layer of the pMTJ, such that the magnetization of the free layer will not be pinned by the magnetic insertion layer(s). In an embodiment, the overall thickness of the magnetic insertion layer(s) is no more than about 30% of the thickness of the free layer. With respect to a magnetic insertion layer of IMA, the in-plane magnetization actually pulls the perpendicular magnetization of the free layer to an angle off the perpendicular orientation. This angled magnetization of the free layer tends to promote an easier switching between AP and P states of the pMTJ, while the angled magnetization is also less stable and sometimes blurs the distinction between the AP and the P states. The magnetization strength, e.g., the thickness, of the IMA insertion layer is optimized based on circuitry or device design with compromises between switching efficiency and MTJ state reading accuracy.

The SOT channel layer includes one or more magnetic insertion layers and one or more heavy metal layers stacked in an alternating manner. A magnetic insertion layer is adjacent to at least one heavy metal layer. A heavy metal layer is adjacent to at least one magnetic insertion layer. In an embodiment, the total number of the heavy metal layers is at least one more than the total number of the magnetic insertion layers such that the SOT channel layer includes a heavy metal layer on the top surface thereof and a heavy metal layer on the bottom surface thereof. In another embodiment, the total number of the magnetic insertion layers is at least one more than the total number of the heavy metal layers such that the SOT channel layer includes a magnetic insertion layer on the top surface thereof and a magnetic insertion layer on the bottom surface thereof. In a further embodiment, the total number of the magnetic insertion layers is the same as the total number of the heavy metal layers such that the SOT channel layer includes a magnetic insertion layer on a first surface thereof and a heavy metal layer on a second surface thereof that is opposite to the first surface.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

FIG. 1 shows an example 2T1MTJ bit cell 100 of a SOT-MRAM device. The bit cell 100 includes a SOT-MTJ device 102 that includes a MTJ structure 110. The MTJ structure 110 includes a dielectric layer 114 sandwiched between a first ferromagnetic layer 112 and a second ferromagnetic layer 116. The first ferromagnetic layer 112 and the second ferromagnetic layer 116 include a same magnetic anisotropy. Specifically, the first ferromagnetic layer 112 and the second ferromagnetic layer 116 either both have in-plane magnetic anisotropy or both have perpendicular magnetic anisotropy. In the description herein, for an illustrative example, the first ferromagnetic layer 112 and the second ferromagnetic layer 116 include perpendicular magnetic anisotropy. The magnetization or magnetic moment of the first ferromagnetic layer 112 maintains a fixed orientation or polarity, e.g., in the down direction as shown by a unidirectional arrow 120, perpendicular to a substrate plane (not shown for simplicity) or a plane which the MTJ 110 sits on. The magnetization orientation of the second ferromagnetic layer 116 is switchable in the perpendicular axis, as shown by a bi-directional arrow 122. The switchable magnetization orientation of the second ferromagnetic layer 116 represents two states thereof with respect to the magnetization orientation of the first ferromagnetic layer 112, a parallel state "P" or an antiparallel state "AP". In the "P" state, the magnetization orientation of the second ferromagnetic layer 116 is in the same direction as that of the first ferromagnetic layer 112, here in the down direction. In the "AP" state, the magnetization orientation of the second ferromagnetic layer 116 is in a different direction from that of the first ferromagnetic layer 112, here in the up direction. In the description herein, the first ferromagnetic layer 112 is referred to as a "reference layer" and the second ferromagnetic layer 116 is referred to as a "free layer." The dielectric layer 114 is a tunnel barrier layer that acts as a barrier to the tunneling of charge carriers between the reference layer 112 and the free layer 116.

A SOT channel layer 130 is positioned adjacent to and in electric coupling with the free layer 116. In an embodiment, the SOT channel layer 130 is in direct contact with the free layer 116. For example, an upper surface 130U of the SOT channel layer 130 is in direct contact with a lower surface 116L of the free layer 116. In some embodiments, to maximize the spin Hall effect ("SHE") between the SOT channel layer 130 and the free layer 116, an interface area 132 between the SOT channel layer 130 and the free layer 116 substantially fully overlaps the lower surface 116L of the free layer 116. That is, the upper surface 130U of the SOT channel layer 130 substantially fully overlaps the lower surface 116L of the free layer 116. In an embodiment, the upper surface 130U is larger than the lower surface 116L in at least some directions.

Due to the tunnel magnetoresistance effect, the resistance value between the reference layer and the free layer changes with the magnetization polarity switch in the free layer 116. The parallel magnetizations (P state) lead to a lower electric resistance across MTJ 110, whereas the antiparallel magnetizations (AP state) lead to a higher electric resistance across MTJ 110. The two states of the resistance values are considered as two logic states "1" or "0" that are stored in the MRAM bit cell 100.

The bit cell 100 includes three terminals R, W and S. In a read operation, a signal from a read control line, e.g., a read Word line 140, turns on a read transistor 142 to enable a read current to flow between a Bit line and a source line through the MTJ structure 110. A value of the read current indicates the resistance value of the MTJ, i.e., the logic state stored in the MRAM cell 100. In a write operation, a signal from a write control line, e.g., a write Word line 150, turns on a write transistor 152 to enable a write current to pass through the SOT channel 130 to generate a spin-orbit torque that changes the magnetization orientation of the free layer 116. The mechanisms of the spin-orbit torque include one or more of spin Hall effect ("SHE") or a Rashba effect. The relative ratios between the SHE and the Rashba effect depend on the device structure, fabrication processes and/or material choices. However, the current disclosure is applicable to and is not limited by all these factors and any resultant ratios between the SHE and Rashba effect. In the description herein, it is assumed that SHE dominates the spin-orbit torque ("SOT"). The terms "SHE" or "SOT" may be used interchangeably in referring to the spin-orbit torque.

As the MTJ 110 includes perpendicular anisotropy, some additional mechanisms may be used to deterministically switch the magnetization orientation of the free layer 116. For example, an additional in-plane magnetic field may be applied. In another example, a shape anisotropy, e.g., the long axis, of the MTJ structure 100 may be position with a canting angle with a current flow direction of the SOT channel 130. All such additional features are possible with the disclosed techniques included in the disclosure.

In some embodiments, the write operation may be implemented with a bidirectional current through the SOT channel 130 to set up the two magnetization orientations, e.g., up or down, in the free layer 116. In other embodiments, the different magnetization orientations in the free layer 116 may be achieved through different switching mechanisms. For example, the AP state writing may be achieved through the SOT effect by an in-plane current passing through the SOT channel 130, while the P state writing may be achieved through the STT effect via a current passing through the MTJ structure 110 in an opposite direction to the read operation. Other approaches of writing to the SOT-MRAM cell 100 are also possible and included in the disclosure.

In the example MRAM cell 100, however, the SOT channel 130 includes a multilayer structure that includes one or more (two shown for illustration) heavy metal layers 130HM of heavy metal materials and one or more (one shown for illustration) magnetic insertion layers 130MI of magnetic material/magnetic properties. The heavy metal layers 130HM and the magnetic insertion layers 130MI are positioned adjacent to one another in an alternating manner. Each heavy metal layer 130HM is adjacent to at least one magnetic insertion layer 130MI. Each magnetic insertion layer 130MI is adjacent to at least one heavy metal layer 130HM.

Through proximity to a magnetic insertion layer 130MI, a surface portion of a heavy metal layer 130HM is magnetized to include a magnetization. The magnetization within the heavy metal layer 130HM enhances spin-dependent scattering, which leads to increased transverse spin imbalance. Resultantly, more spins are accumulated at the boundaries of the heavy metal layer 130HM, which generate stronger magnetic torques in the free layer 116 of the pMTJ 110. In other words, the magnetic insertion layer 130MI improves the conversion rate from an in-plane current flowing through the SOT channel 130 to a magnetic torque on the magnetic polarity of the free layer 116 of the pMTJ 110.

Figure 2:
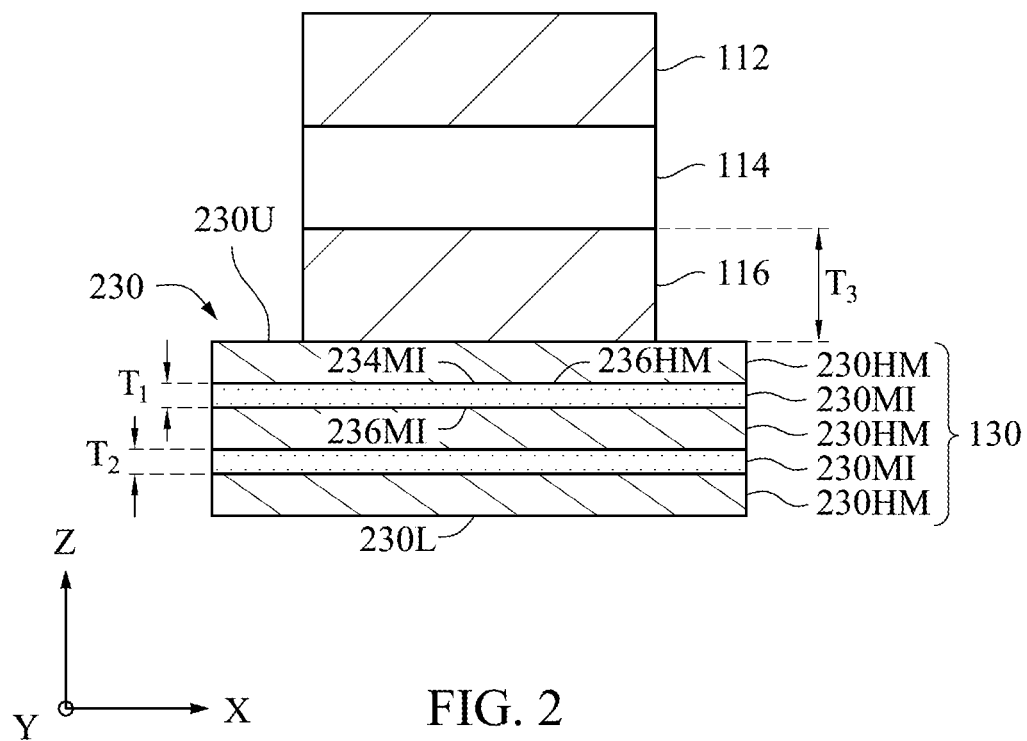
FIGS. 2-6 are sectional views of example SOT channels.
Figure 3:
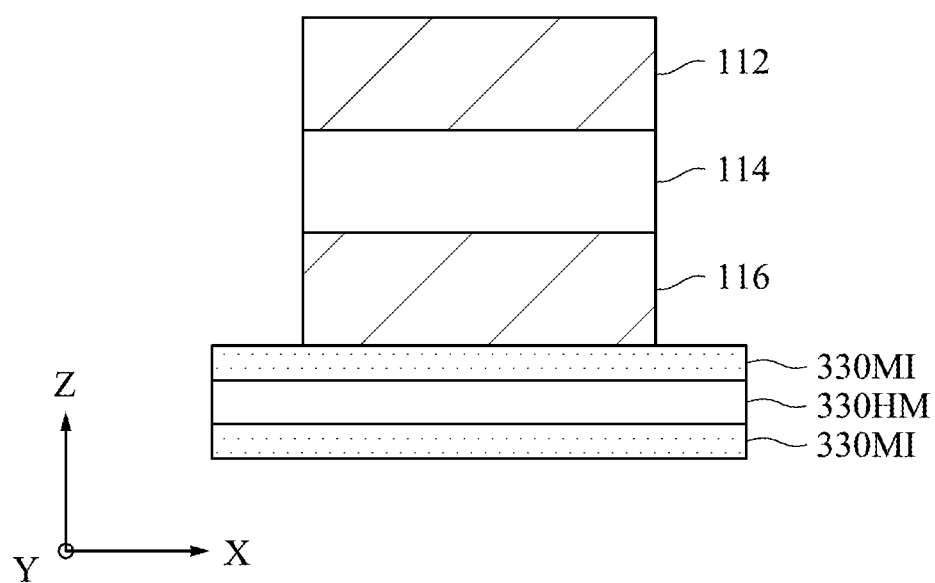
Figure 4:
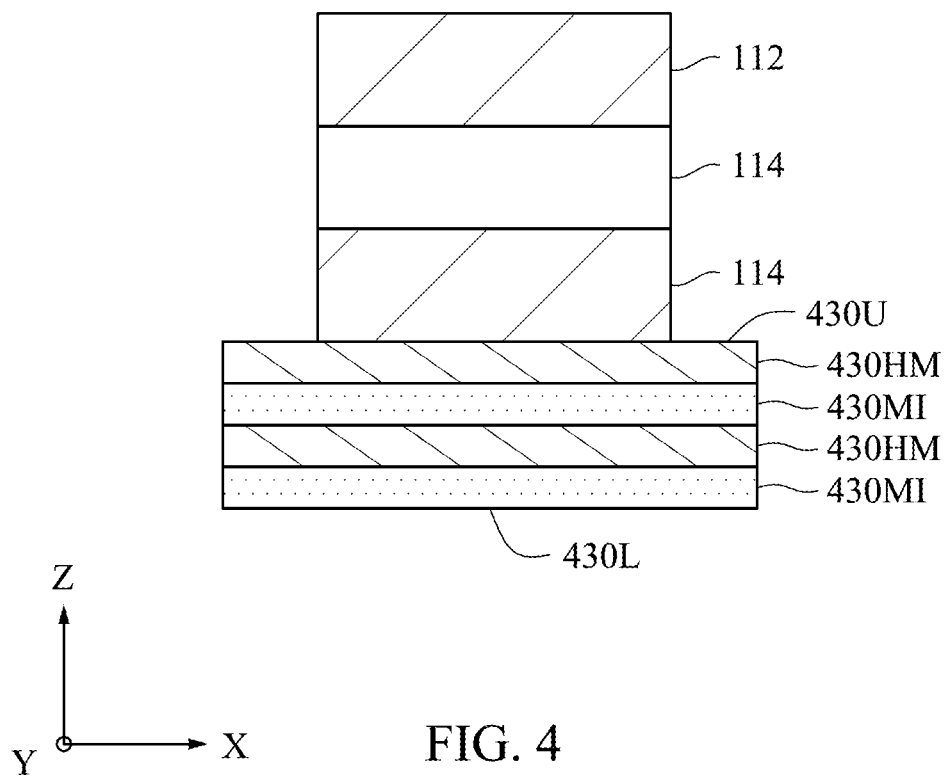

FIGS. 2, 3 and 4 show example embodiments of the SOT channel 130. Referring to FIG. 2, the SOT channel layer 230 includes three heavy metal layers 230HM and two magnetic insertion layers 230MI. The total number of the heavy metal layers 230HM is more than the total number of the magnetic insertion layer 230MI. As the heavy metal layers 230HM and the magnetic insertion layers 230MI are arranged in an alternating manner, the extra heavy metal layer 230HM leads to the SOT channel layer 230 including a heavy metal layer 230HM on both the top surface 230U and the bottom surface 230L of the SOT channel layer 230.

As shown in FIG. 2, a heavy metal layer 230HM is on the top surface 230U of the SOT channel 230. An upper surface 234HM of the heavy metal layer 230HM interfaces with the free layer 116 of the MTJ structure 110. A lower surface 236HM of the heavy metal layer 230HM interfaces with an upper surface 234MI of an underlying magnetic insertion layer 230MI. A lower surface 236MI of the underlying magnetic insertion layer 230MI interfaces with another heavy metal layer 230HM. The identified upper surface and lower surface of a respective heavy metal layer 230HM or a magnetic insertion layer 230MI are opposite to one another.

In an embodiment, the two magnetic insertion layers 230MI both have PMA in a same magnetic polarity, e.g., both pointing perpendicularly upward. In the case that the magnetic insertion layers 230MI have perpendicular magnetic anisotropy "PMA", the magnetization strength of the magnetic insertion layers 230MI are controlled to be relatively low compared to that of the free layer 116. In an embodiment, in a case that the magnetic insertion layers 230MI are in the same perpendicular magnetic polarity orientation, the overall thickness of the two magnetic insertion layers 230MI, i.e., T1+T2, is no more than ⅓ of the thickness T3 of the free layer 116. In an alternative embodiment, the multiple magnetic insertion layers 230MI are of different perpendicular magnetic polarity orientations. The magnetization strength of the most adjacent magnetic insertion layer 230MI is relevant to the free layer 116 and the thickness T1 of the most adjacent magnetic insertion layer 230MI is controlled to be no more than ⅓ of the thickness T3 of the free layer 116.

In another embodiment, the magnetic insertion layers 230MI have in-plane magnetic anisotropy "IMA." The in-plane magnetization of the magnetic insertion layers 230MI will pull the magnetization of the free layer 116 off the perpendicular direction with an angle. Because the magnetization of the free layer 116 is pulled off from the perpendicular direction, it is easier to switch the magnetization of the free layer 116 between the P state direction and the AP state direction. On the other hand, when the magnetization of the free layer is pulled off from the perpendicular orientation, the AP or P state of pMTJ structure 110 is less stable and it is more difficult to read the magnetoresistance state of the pMTJ structure 110 because the angled magnetization orientation of the free layer 116 tends to blur the distinction between the P and the AP states. As such, the magnetization strength of the magnetic insertion layers 230MI are optimized based on the circuit design and/or the device designs. The magnetization strength of the IMA magnetic insertion layers 230MI are related to the thickness T1, T2 of the respective IMA magnetic insertion layers 230MI. Therefore, the thickness T1, T2 of the IMA magnetic insertion layers 230MI is controlled based on the circuit designs and the device designs of the pMTJ structure 110.

The heavy metal layers 230HM are one or more of tungsten W, platinum Pt, tantalum Ta, or other suitable heavy metal materials. The material of the magnetic insertion layers 230MI is selected such that the crystalline lattice of the magnetic insertion layer 230MI and the crystalline lattice of the adjacent heavy metal layer 230HM do not impact or mismatch one another. The lattice matching or mismatching between the magnetic insertion layer 230MI and the adjacent heavy metal layer 230HM is determined based on the size and the shape of the crystalline lattices thereof. For example, Fe, FeB, CoFeB, $Fe_3O_4$, or other magnetic materials have a lattice mismatch <5%. The choice of the magnetic insertion layer 230MI material also depends on the magnetic anisotropy of the magnetic insertion layer. For example, in the case that the heavy metal layers 230HM are one or more of W, Pt or Ta, the cobalt/platinum Co/Pt multilayer (or alloy) or cobalt/nickel Co/Ni multilayer (or alloy) may be used as perpendicular magnetic anisotropy PMA magnetic insertion layer(s) 230MI. CoFeB magnetic alloy ("CFB") or permalloy (nickel-iron magnetic alloy) may be used as in-plane magnetic anisotropy IMA insertion layers.

In some embodiments, for the PMA Co/Pt or Co/Ni multilayers, each of the Co, Pt, Ni layers may be about 2 Å to about 6 Å in thickness. As such, the magnetic insertion layers 230MI may be about 4 Å to about 12 Å in thickness, T1, T2. For the magnetic insertion layer 230MI of IMA, the CFB material may be deposited with a thickness of larger than 15 Å. A relatively thinner CFB layer, e.g., thickness smaller than 12 Å, generally exhibits a PMA property. A thicker CFB layer, e.g., thickness larger than 15 Å, generally exhibits an IMA property. The permalloy may be deposited with a thickness ranging from about 5 Å to about 20 Å.

In some embodiments, in the case that one or more of the heavy metal layers 230HM is Pt, layers of cobalt Co may be used as the magnetic insertion layer. A cobalt layer itself may not have required magnetic anisotropy, while the interfacing between the Co and the Pt creates magnetic anisotropy and magnetization suitable for increasing the spin scattering within the Pt layers 230HM.

FIG. 3 shows another embodiment of the SOT channel. In SOT channel 330, the total number of magnetic insertion layers 330MI, here two 330MI layers, is more than the total number of heavy metal layer 330HM, here one 330HM layer. The magnetic insertion layers 330MI and the heavy metal layer 330HM are arranged adjacent to one another in an alternating manner. The top surface 330U and the bottom surface 330L of the SOT channel layer 330 are both magnetic insertion layers 330MI. As the magnetic insertion layer 330MI at the top surface 330U interfaces with the free layer 116, the material of the magnetic insertion layer 330MI is selected such that the surface lattice of the magnetic insertion layer 330MI and the surface lattice of the free layer 116 do not impact each other. The "impact" is determined based on whether the desired magnetic properties of either layers are substantially changed through the interfacing. The spin orientation of the free layer should not be substantially affected by the insertion layer, which could cause a tilting angle larger than 18 degrees or effectively cause a reduction in TMR more than 10%. Other than the above identified differences, the descriptions of the SOT channel layers 130, 230 similarly apply to the SOT channel layer 330, which is omitted for simplicity purposes.

FIG. 4 shows another example SOT channel 430. The SOT channel 430 includes a same number of magnetic insertion layers 430MI and heavy metal layers 430HM arranged adjacent to one another in an alternating manner. One of the top surface 430U or the bottom surface 430L of the SOT channel layer 430 is magnetic insertion layers 430MI and the other one of the top surface 430U or the bottom surface 430L of the SOT channel layer 430 is a heavy metal layer 430HM.

Figure 5:
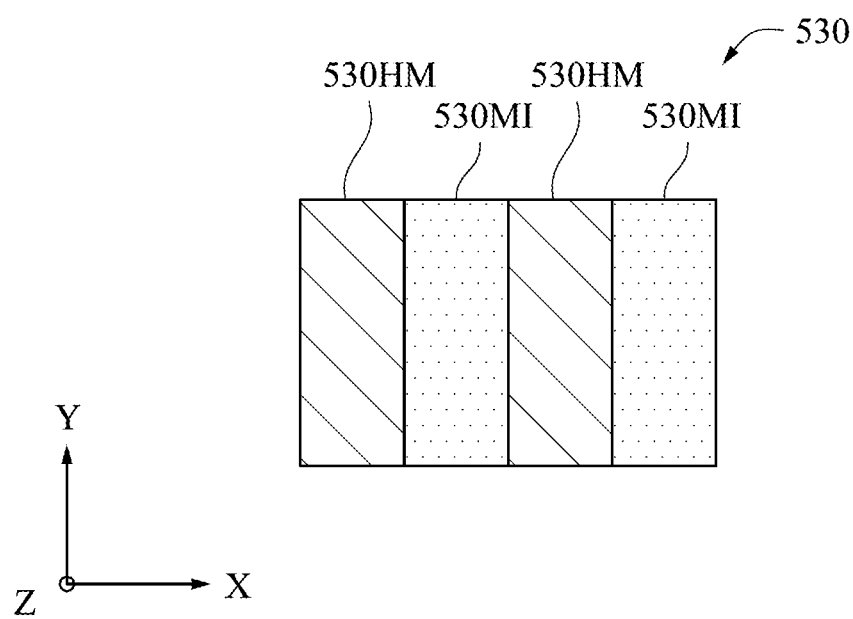

As shown in FIGS. 1, 2, 3, 4, the magnetic insertion layers and the heavy metal layers in the SOT channels 130, 230, 330, 430 are stacked vertically in an alternating manner. These examples do not limit the scope of the disclosure. FIG. 5 shows a top view of another example SOT channel 530. As shown in FIG. 5, the SOT channel 530 includes heavy metal layers 530HM and magnetic insertion layers 530MI arranged laterally adjacent to one another in an alternating manner. Other descriptions of the SOT channel 530 are similar to that of the other SOT channels 130, 230, 330, 430 and are omitted for simplicity.

As shown in FIGS. 1-5, the magnetic insertion layers in a SOT channel are separated from one another and the heavy metal layers in a SOT channel are separated from one another. These example embodiments do not limit the scope of the disclosure. In other embodiment, one or more of the magnetic insertion layers or the heavy metal layers in a SOT channel may be coupled to one another in various manners.

Figure 6:
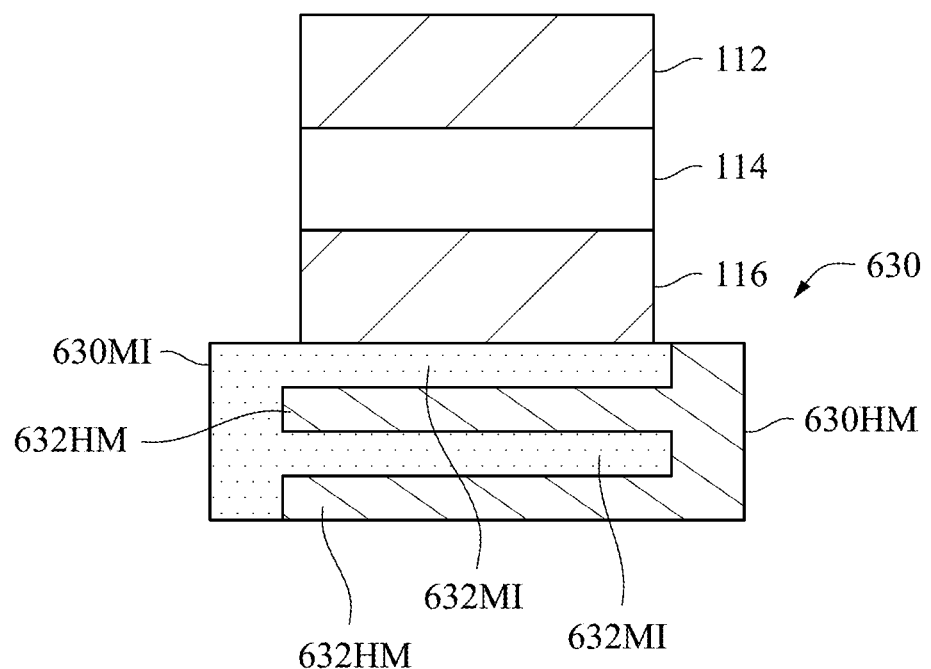

For example, FIG. 6 shows an example SOT channel 630 that includes a comb-shaped magnetic insertion layer 630MI and a comb-shaped heavy metal layer 630HM. The comb-shaped magnetic insertion layer 630MI includes tooth elements 632MI. The comb-shaped heavy metal layer 630HM includes tooth elements 632HM. The tooth elements 632MI and the tooth elements 632HM are arranged adjacent to one another in an alternating manner.

Other variants of the arrangements among the heavy metal layers and the magnetic insertion layers are also possible and included in the disclosure. The disclosed embodiments of the heavy metal layers and the magnetic insertion layers can be combined in various ways, which are also included in the disclosure.

Figure 7:
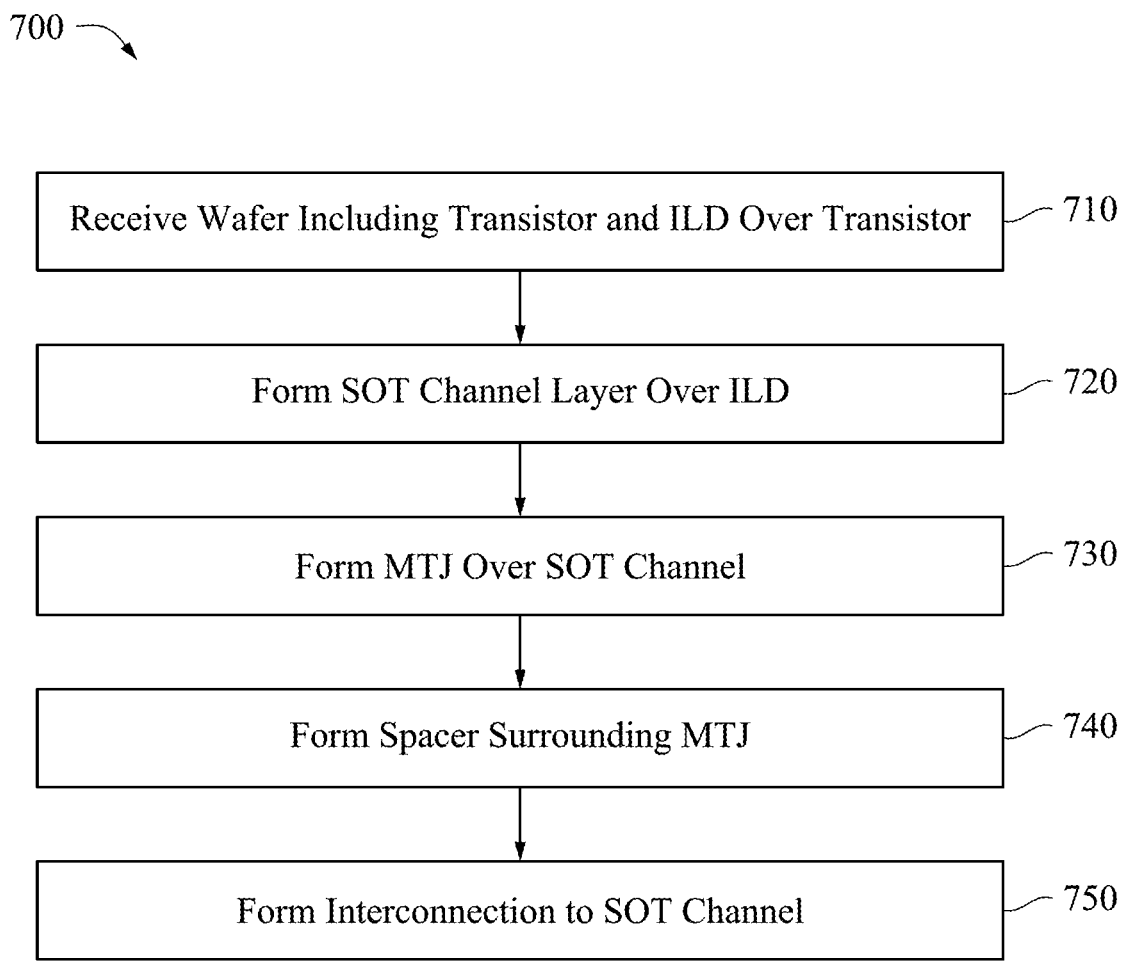
FIG. 7 is an example process.

FIG. 7 shows an example process 700 which may be used to make the MRAM 100 including the SOT-MTJ structure 102 or other semiconductor structures. FIGS. 8A to 8E show a wafer 800 in various stage of the process of FIG. 7.

Figure 8A:
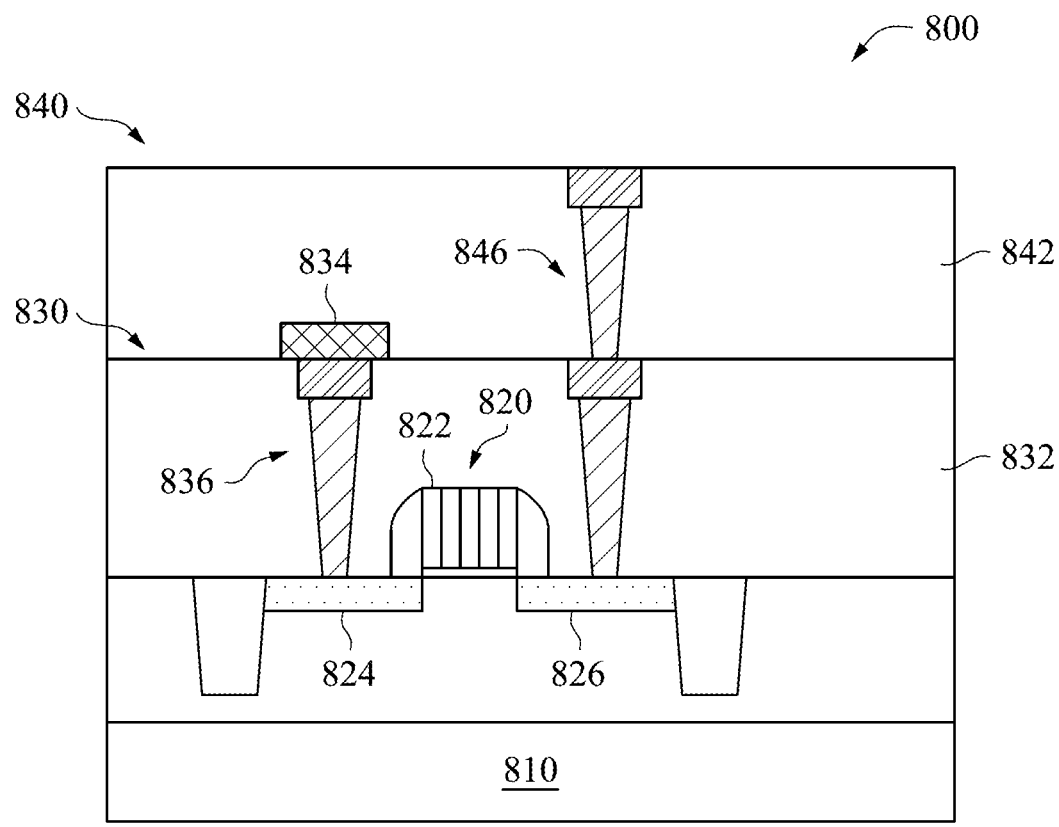
FIGS. 8A to 8E are various stages of a wafer under the example process of FIG. 7.

Referring to FIG. 7, in example operation 710, a wafer 800 is received. The wafer 800 includes a substrate 810 and a transistor 820 formed over the substrate 810. The transistor 820 includes a gate 822, a first source/drain structure 824 and a second source/drain structure 826. The wafer 800 also includes a first back-end-of-line ("BEOL") level 830 that is formed over the transistor 820 and a first inter-level dielectric ("ILD") layer 832. For example, a Bit line 834 is on the first BEOL level 830. FIG. 8A shows, as an illustrative example, that the first BEOL level 830 is one level, e.g., one layer of ILD 832, over the transistor 820, which is not limiting. The first BEOL level 830 may be formed on more than one level over the transistor 820. All are included in the disclosure. The Bit line 834 is electrically coupled to the first source/drain structure 824 through interconnect structures 836, e.g., a contact plug or via.

The substrate 810 may be a semiconductor substrate or a silicon-on-insulator substrate suitable for a front-end-of-line ("FEOL") process. The substrate 810 may also be a back-end-of-line ("BEOL") substrate having a dielectric surface layer and FEOL devices under the dielectric surface. As such, the transistor 820 may be FEOL transistor or a thin-film transistor formed over dielectric layers in a BEOL process.

The wafer 800 also includes a second BEOL level 840 formed at a different level from the first BEOL level 830 over the transistor 820. FIG. 8A shows, as an illustrative example, that the second BEOL level 840 is formed over the first BEOL level 830, which is not limiting. It is possible that the second BEOL level 840 is formed below the first BEOL level 830 while the Bit line 834 on the first BEOL level 830 is formed after structures on the second BEOL level 840 have been formed. The second BEOL level 840 is formed over the second ILD layer 842. Interconnect structures 846 are already formed in the wafer 800 for coupling features on the second BEOL level 840. In an example, the second interconnect structure 846 is electrically coupled to the second source/drain structure 826 of the transistor 820.

Figure 8B:
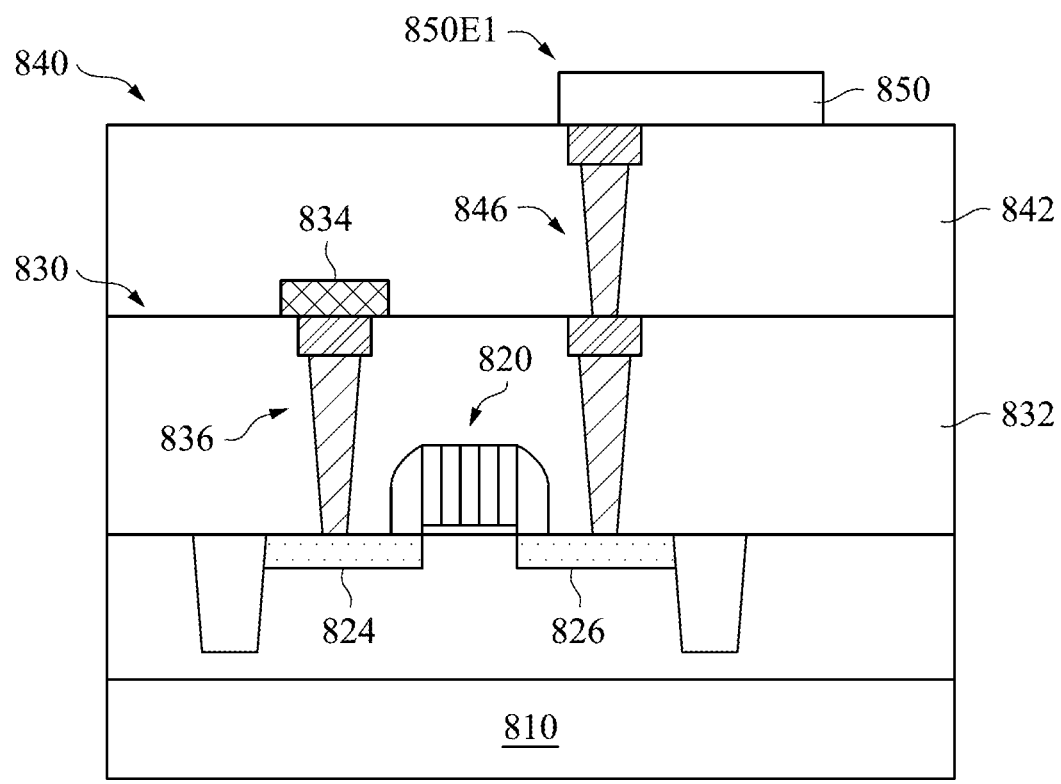

In example operation 720, with reference also to FIG. 8B, a SOT channel 850 is formed on the second BEOL level 840. Specifically, the SOT channel 850 is formed over the second ILD layer 842. A first end 850E1 is coupled to the second interconnect structure 846, which is coupled to the second source/drain structure 826.

The formation of the SOT channel 850, as an overall structure, may be implemented through any suitable approaches and all are included in the disclosure. For example, the SOT channel 850 materials may be initially formed as a layer(s) over the wafer 800 surface and later patterned to form the SOT channel 850. For another example, a lift-off or a damascene process is used to form the SOT channel 850. For example, a dielectric layer (not shown for simplicity) is formed over the second ILD layer 842 and is patterned to open an aperture exposing the second interconnect structure 846. The SOT channel 850 is formed within the aperture. The excessive deposition material may be removed together with the dielectric material in a lift-off process or be removed through a CMP process in a damascene process. The dielectric layer may be further patterned to form other structures, e.g., a spacer structure adjacent to the SOT channel layer 850. Optionally, an etch stop layer (not shown for simplicity), e.g., of silicon nitride is formed between the dielectric layer and the second ILD 842. The specific examples of forming the SOT channel 850 are further described herein.

Optionally, an electrode layer (not shown for simplicity purposes), referred to as bottom electrode for descriptive purposes, is formed between the SOT channel layer 850, e.g., the first end 850E1 thereof, and the second interconnect structure 846.

Figure 8C:
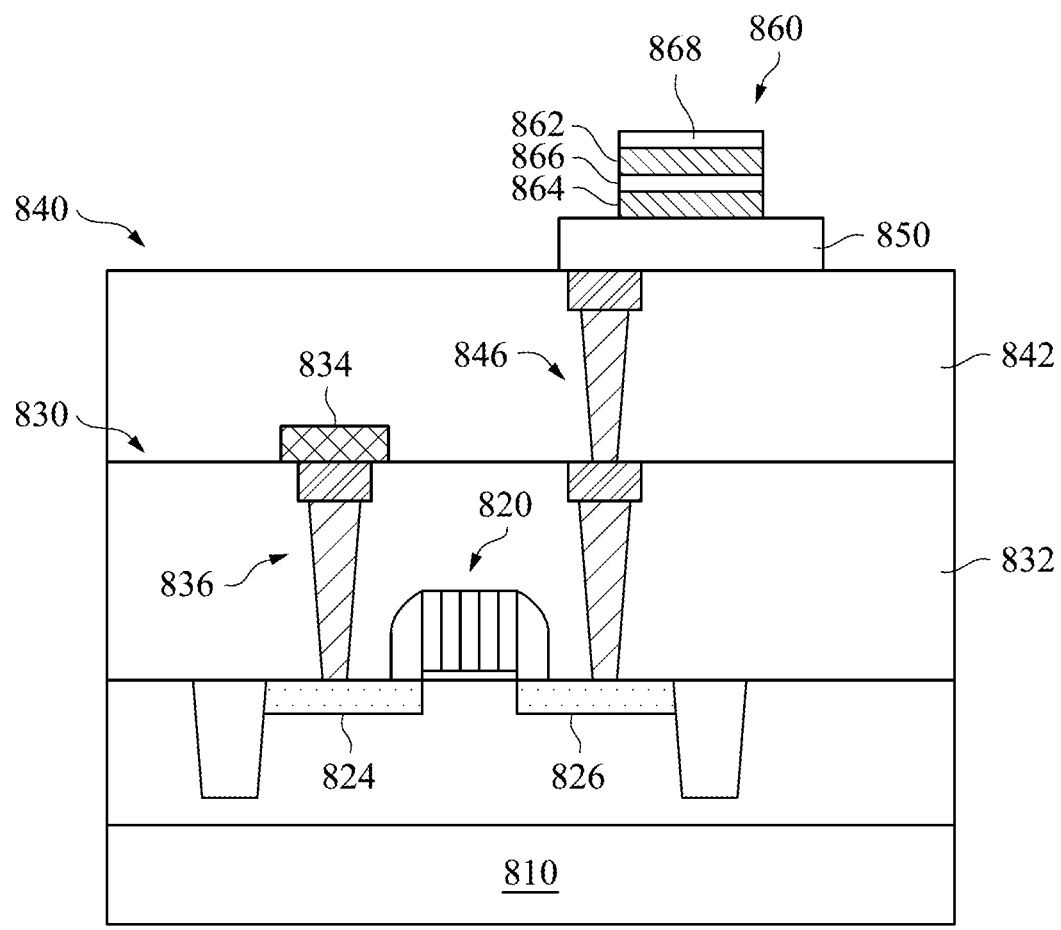

In example operation 730, with reference also to FIG. 8C, a MTJ structure 860 is formed adjacent to, e.g., over, the SOT channel 850. The MTJ structure 860 includes a first ferromagnetic layer 862 and a second ferromagnetic layer 864, which are separated by a tunneling barrier layer 866. As an illustrative example, the first ferromagnetic layer 862 has a fixed or "pinned" magnetization orientation and the second ferromagnetic layer 864 has a switchable or free magnetization orientation. The first ferromagnetic layer 862 is referred to as the "reference layer" 862 and the second ferromagnetic layer 864 is referred to as the "free layer" 864. In an embodiment, the free layer 864 is one or more of Fe, Co, Ni, FeCo, CoNi, CoFeB, FeB, FePt, FePd or other suitable ferromagnetic material. The reference layer 862 is one or more of Fe, Co, Ni, FeCo, CoNi, CoFeB, FeB, FePt, FePd or other suitable ferromagnetic material. In an embodiment, the reference layer 862 is a synthetic anti-ferromagnetic structure that includes one or more non-magnetic ("NM") metal layers each sandwiched between two pinned ferromagnetic ("FM") layers. In an embodiment, the free layer 864 is a synthetic anti-ferromagnetic structure that includes a non-magnetic metal layer sandwiched between two free ferromagnetic layers. For example, the free layer 864 may include a Ta layer sandwiched between two CoFeB layers.

In some embodiments, a capping layer 868, e.g., of $WO_2$, NiO, MgO, $Al_2O_3$, $Ta_2O_8$, $MoO_2$, TiO, GdO, Al, Mg, Ta, Ru or other suitable materials are formed over the reference layer 862.

The layers of the MTJ 860 may be deposited over the surface of the wafer 800 and patterned to form the MTJ 860 structure. Other approaches, like the lift-off process or the damascene process, are also available to form the MTJ structure 860. A shape anisotropy of the MTJ 860 may have a canting angle with a current flow direction of the SOT channel 850.

Figure 8D:
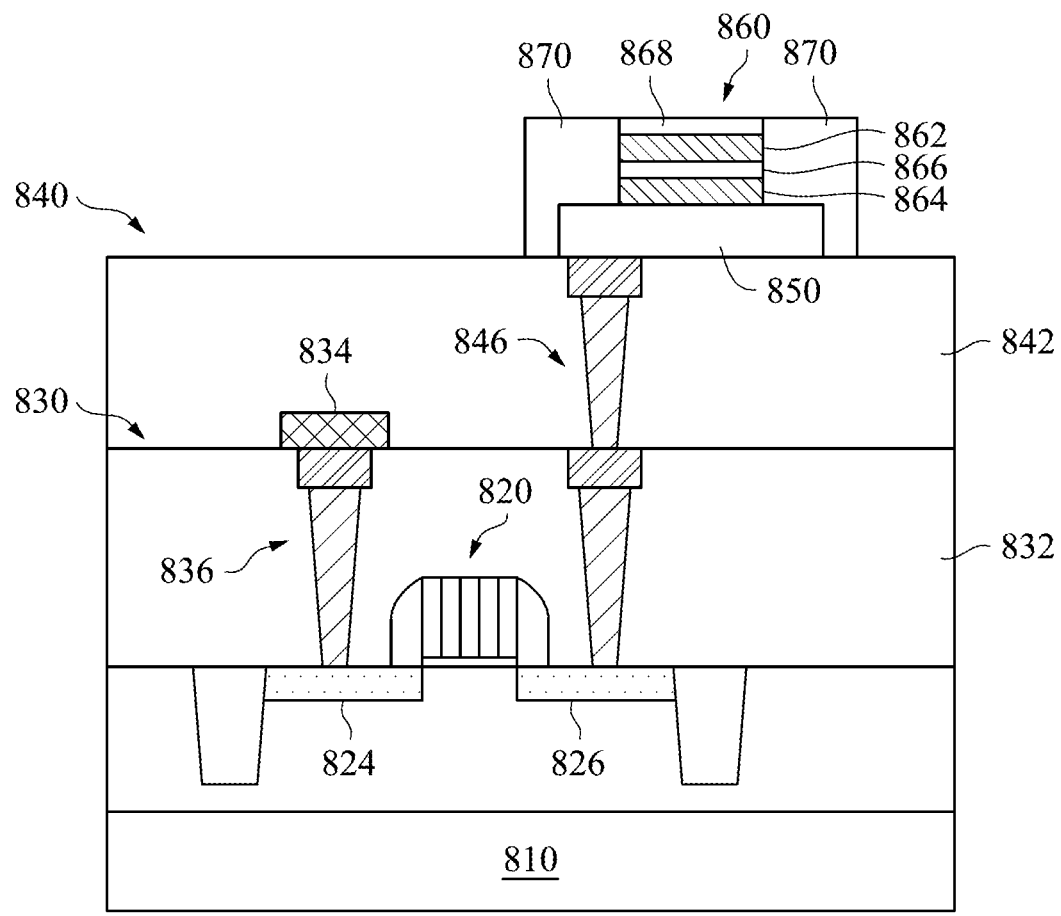

In example operation 740, with reference also to FIG. 8D, optionally, a spacer 870 is formed adjacent to the MTJ structure 860 and the SOT channel 850. The spacer 870 may be formed using any suitable deposition techniques and is typically formed conformally. The spacer 870 is one or more of SiN, SiC, $Si_3N_4$, SiON or other suitable dielectric materials that is different from the dielectric material of the first ILD layer 832 and/or the second ILD layer 842, which is silicon oxide or low-K dielectric materials.

The example structure of FIG. 8D is provided as an illustrative example of a SOT-MRAM cell and the silicon implementation. Alternative or additional MTJ structures and silicon implementations are also possible and included in the disclosure. For example the SOT-MRAM cell may also include an AP-coupling layer and a hard layer (not shown for simplicity) adjacent to the reference layer 862 to pin the magnetization orientation of the reference layer 862. The SOT-MRAM cell may also include an antiferromagnetic layer and/or a ferromagnetic biasing layer adjacent to the free layer 864, which functions to facilitate the SOT effect in switching the magnetization orientation of the free layer 864. A bottom electrode may be formed adjacent to the SOT channel 850 and a top electrode may be formed adjacent to the reference layer 862. These additional or alterative features are all possible and included in the disclosure.

FIG. 8D shows that in the MTJ structure 860, the free layer 864 is stacked below the reference layer 862 for illustrative purposes. In other embodiment, the free layer 864 is stacked over the reference layer and the SOT channel layer 850 is position adjacent to the free layer over the reference layer.

In an embodiment, the reference layer 862 or the respective electrode thereof is electrically coupled to the Bit line 834 through interconnect structures and another transistor, which are not shown for simplicity.

FIG. 8D shows that the SOT channel 850 connects directly to the interconnect structure 846, which is not limiting. The SOT channel 850 may be electrically coupled to the second source/drain structure 826 through an electrode and interconnect structures coupled to the electrode.

The ILD layers 832, 842 are each silicon oxide or suitable low-K dielectric materials.

Figure 8E:
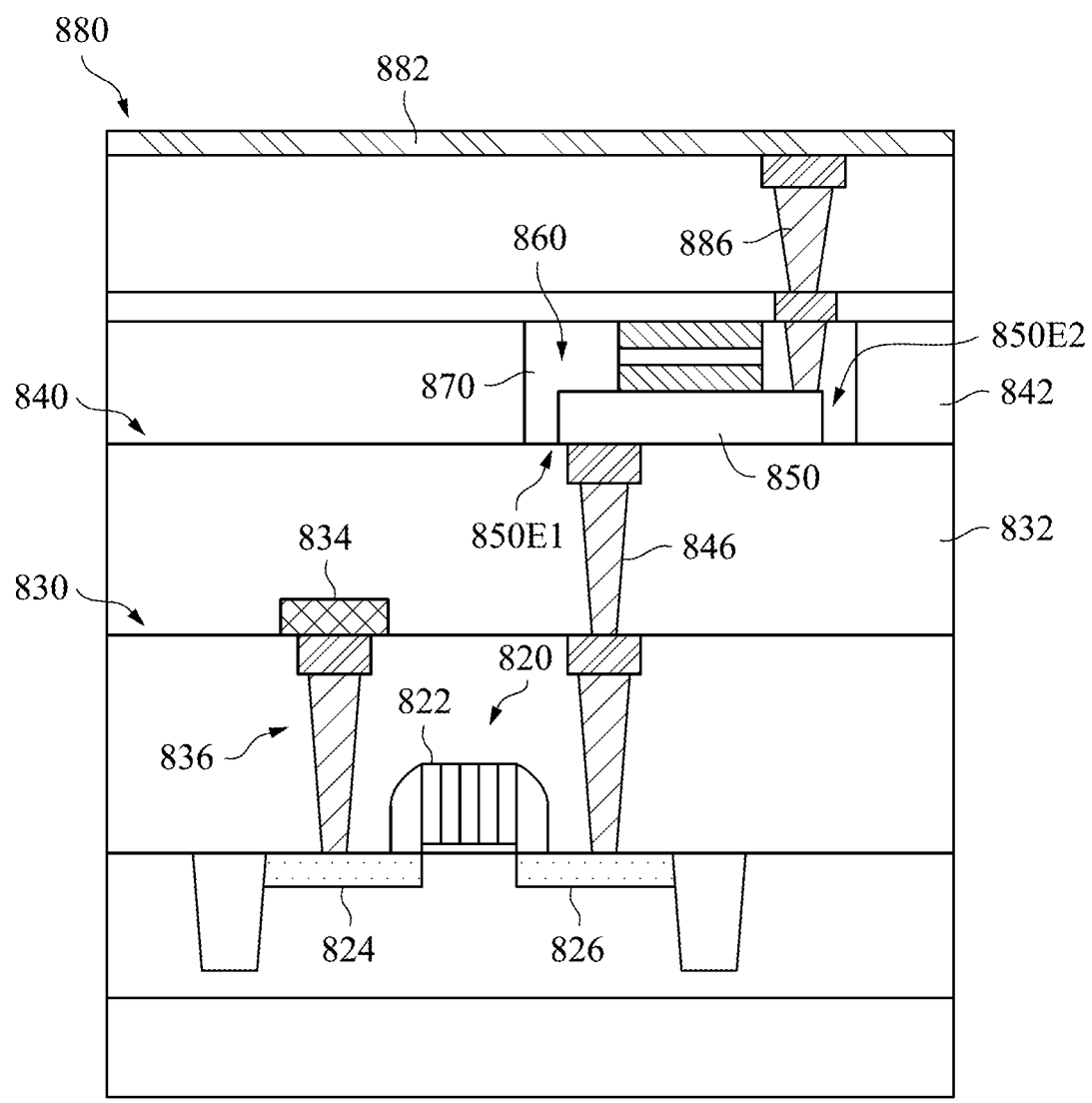

In example operation 750, with reference also to FIG. 8E, a source line 882 is formed over a third BEOL level 880. The source line 882 is coupled, through interconnect structures 886, to a second end 850E2 of the SOT channel 850. In an embodiment, an in-plane write current is configured to flow from the first end 850E1 to the second end 850E2.

Figure 9:
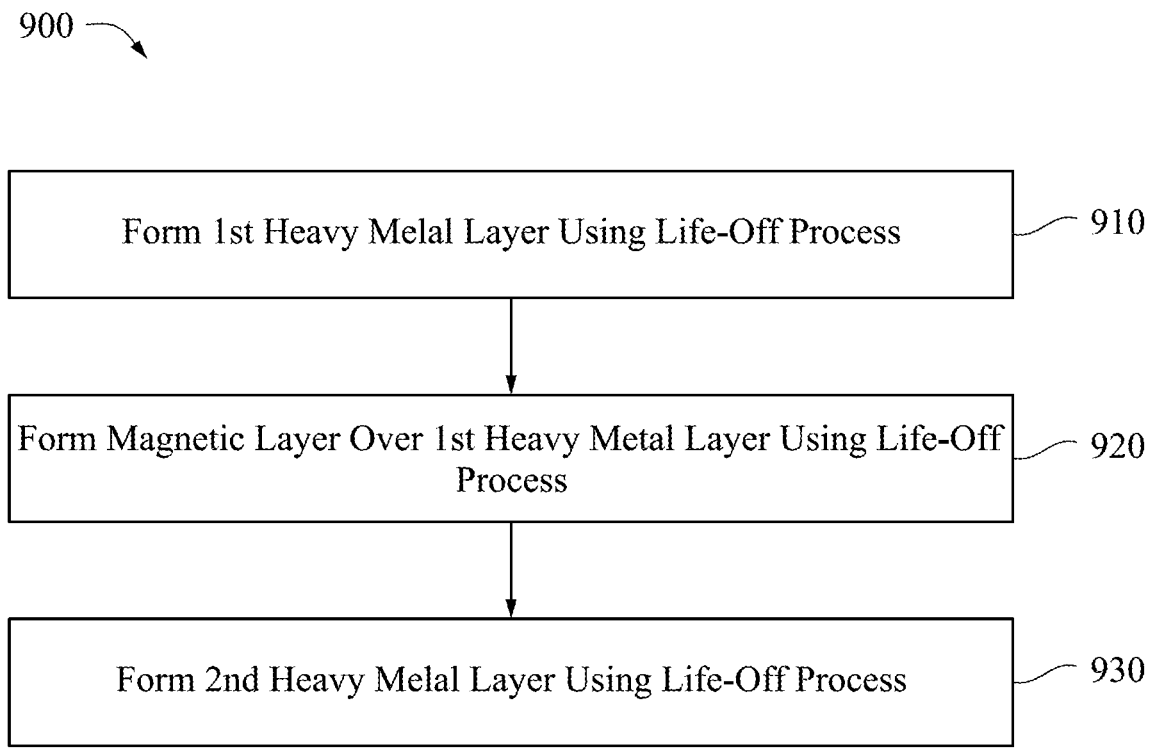
FIG. 9 is another example process.
Figure 10A:
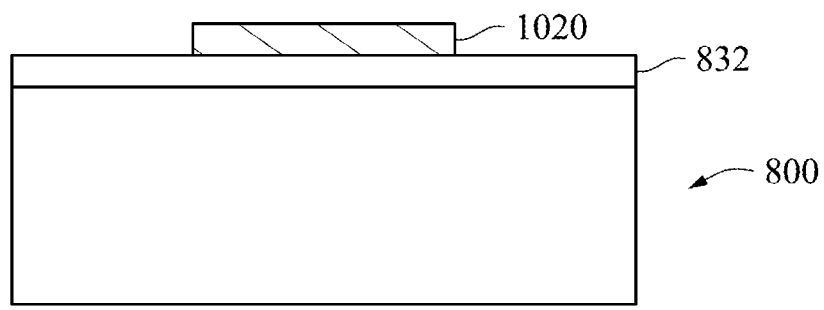
FIGS. 10A to 10C are various stages of a wafer under the example process of FIG. 9.
Figure 10B:
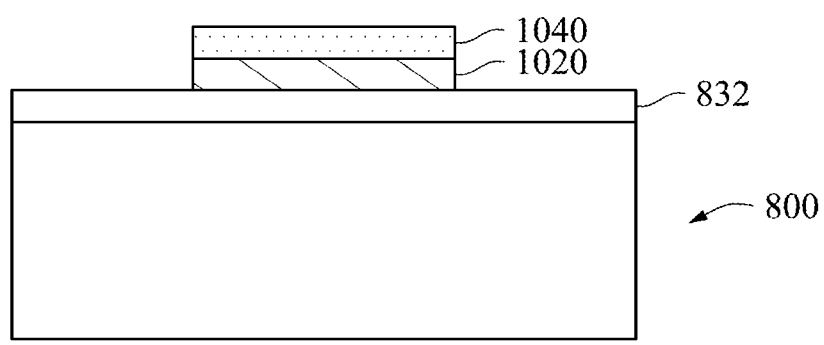
Figure 10C:
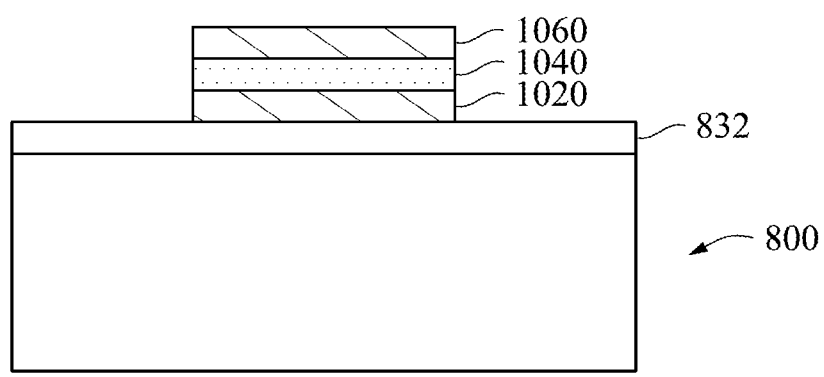

FIG. 9 shows an example process 900 of forming an example SOT channel 850, which is similar to the example SOT channel 130 of FIG. 1. FIGS. 10A to 10C show various stages of a wafer 800 in the example process 900.

Referring to FIG. 9, in example operation 910, with reference also to FIG. 10A, a first layer 1020 of a heavy metal material, e.g., tungsten, is formed over a substrate, e.g., the substrate 810 having the second ILD layer 832. The first tungsten layer 1020 is deposited as a thin film using pulsed laser deposition, chemical vapor deposition, atomic layer deposition, physical vapor deposition or other suitable deposition techniques. In an embodiment, a physical vapor deposition process, e.g., sputtering, is used to form the first tungsten layer 1020. In an embodiment, the first tungsten layer 1020 is formed through a lift-off process such that the first tungsten layer 1020 is patterned upon deposition.

The thickness of the first tungsten layer 1020 is controlled to be in a range of about 5 Å to about 15 Å. In an embodiment, the thickness of the first tungsten layer 1020 is controlled to be in a range of about 5 Å to about 10 Å. The controlled thickness ranges facilitate the SOT effects in that electrons bunce between/among the dielectric molecules deposited on upper surface 1020U and/or lower surface 1020L of the first tungsten layer 1020.

In example operation 920, a magnetic insertion layer 1040 of Co/Pt multilayer is formed over the first tungsten layer 1020. The Co/Pt layer 1040 is formed through physical vapor deposition, e.g., sputtering, at room temperature such that the surface lattice structure of the Co/Pt multilayer is maximally maintained. The Co/Pt layer 1040 is formed through the lift-off process.

In example operation 930, a second tungsten W layer 1060 is formed over the Co/Pt multilayer 1040 using similar processes as those for forming the first Co/Pt multilayer 1020.

It should be appreciated that the SOT channel 850 may include more or less heavy metal layers 1020, 1060 and more magnetic insertion layers 1040.

The layers 1020, 1040 or 1060 of the SOT channel layer 850 may be annealed with a relatively low temperature, e.g., around 400° C., for reflow control purposes. The annealing preferably does not change or modify the crystalline lattice structure of the heavy metal layers 1020, 1060 or the magnetic insertion layer 1040.

Figure 11:
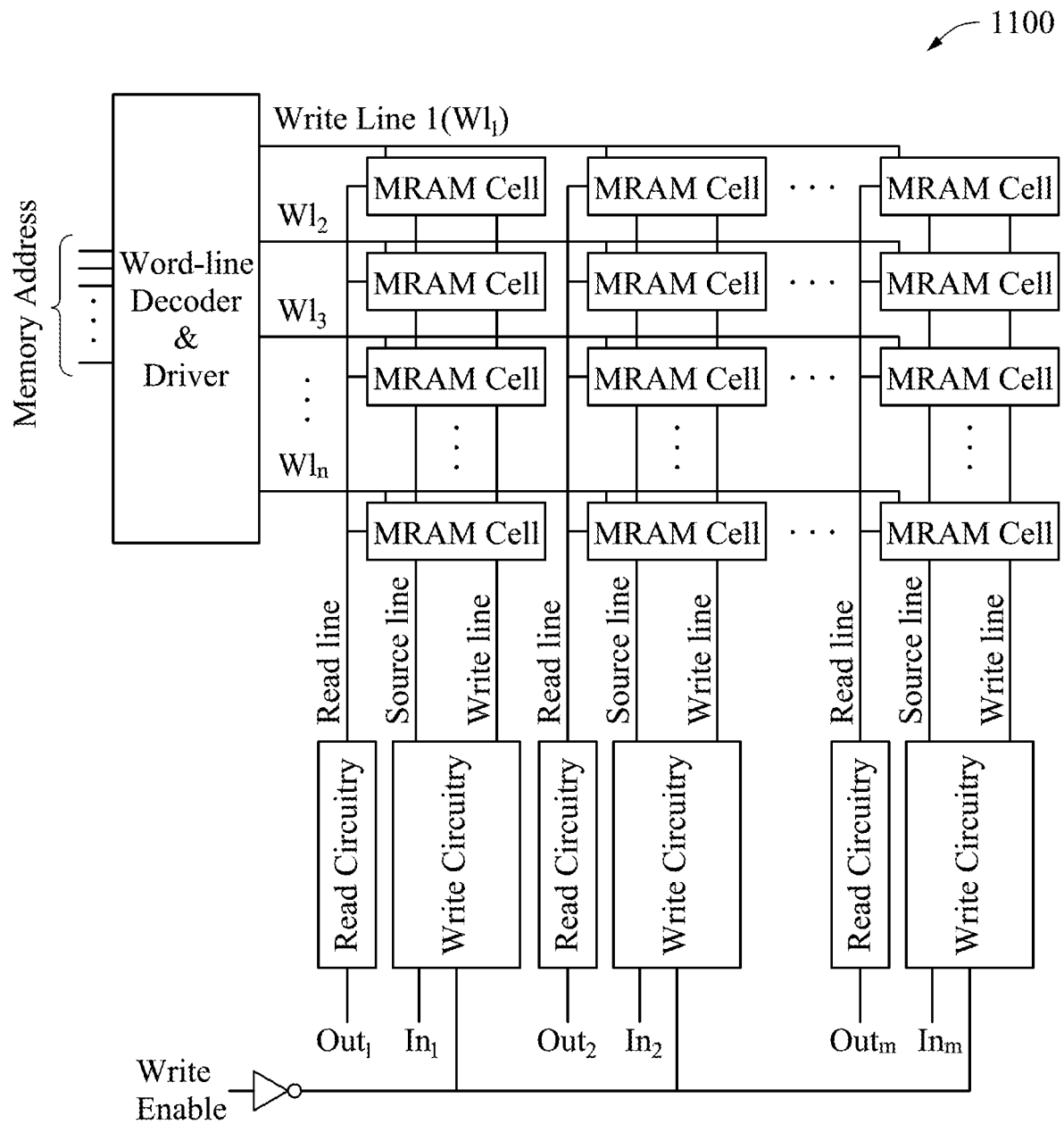
FIG. 11 is an example SOT-MRAM architecture.

In the description herein, the read and write lines of the MRAM cells are illustrated as implemented through Word lines, which is not limiting. It is also possible, depending on MRAM circuitry design, that the read and write lines are implemented through Bit lines. For example, FIG. 11 illustrates an example MRAM architecture 1100. In the example architecture 1100, the write Bit line and the read Bit line are controlled by an example write enable signal which, for example, turns on/off the transistors to enable the write or read function of each MRAM cell in the architecture 1100. Other SOT-MRAM architectures are also possible and included in the disclosure.

In the description herein, the SOT channel 850 is formed before and below the MTJ structure 860, which is not limiting. In other embodiments, the SOT channel is formed over the MTJ structure, with the free layer of the MTJ structure stacked over the reference layer. The SOT channel being formed subsequent to the MTJ structure is advantageous in some scenarios because the SOT channel will not be impacted by the annealing process of modifying the lattice structures of the ferromagnetic layers of the MTJ structure.

The source/drain regions 824, 826 includes one or more of Ge, Si, GaAs, AlGaAs, SiGe, GaAsP, SiP, SiC, silicon-carbon-phosphide ("SiCP"), silicon-germanium-boron ("SiGeB") or other suitable semiconductor materials and may be doped in-situ during the epitaxy process by the supply of impurity sources or may be doped through post implantation process. The possible dopants include boron for SiGe, carbon for Si, phosphorous for Si or SiCP.

The gate electrode 822 of the transistor 820 includes a conductive material, e.g., a metal or a metal compound. Suitable metal materials for the gate electrode include ruthenium, palladium, platinum, cobalt, nickel, and/or conductive metal oxides and other suitable P type metal materials and may include hafnium (Hf), zirconium (Zr), titanium (Ti), tantalum (Ta), aluminum (Al), aluminides and/or conductive metal carbides (e.g., hafnium carbide, zirconium carbide, titanium carbide, and aluminum carbide), and other suitable materials for N type metal materials. In some examples, the gate electrode 822 includes a work function layer tuned to have a proper work function for enhanced performance of the field effect transistor devices. For example, suitable N type work function metals include Ta, TiAl, TiAlN, TaCN, other N type work function metal, or a combination thereof, and suitable P type work function metal materials include TiN, TaN, other p-type work function metal, or a combination thereof. In some examples, a conductive layer, such as an aluminum layer, is formed over the work function layer such that the gate electrode includes a work function layer disposed over the gate dielectric and a conductive layer disposed over the work function layer and below the gate cap. In an example, the gate electrode has a thickness ranging from about 8 nm to about 40 nm depending on design requirements.

The gate dielectric layer includes a high dielectric constant (high K) dielectric material selected from one or more of hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), combinations thereof, and/or other suitable materials. A high K dielectric material, in some applications, may include a dielectric constant (K) value larger than 6. Depending on design requirements, a dielectric material of a dielectric contact (K) value of 9 or higher may be used. The high K dielectric layer may be formed by atomic layer deposition (ALD) or other suitable technique. In accordance with embodiments described herein, the high K dielectric layer includes a thickness ranging from about 10 to about 30 angstrom (Å) or other suitable thickness.

The substrate 810 may include a silicon substrate in crystalline structure and/or other elementary semiconductors like germanium. Alternatively or additionally, the substrate may include a compound semiconductor such as silicon carbide, gallium arsenide, indium arsenide, and/or indium phosphide. Further, the substrate may also include a silicon-on-insulator (SOI) structure. The substrate may include an epitaxial layer and/or may be strained for performance enhancement. The substrate may also include various doping configurations depending on design requirements as is known in the art such as p-type substrate and/or n-type substrate and various doped regions such as p-wells and/or n-wells.

The semiconductor structure/transistor device 820 is a lateral or a vertical transistor or other semiconductor devices, like bipolar devices. The transistor is finFET, tunnel FET ("TFET"), gate-all-around ("GAA") or other devices depending MRAM circuitry design.

FIG. 8E shows that the SOT-MTJ structure 850, 860 is formed subsequent to the transistor 820 of the MRAM circuit. This example does not limit the scope of the disclosure. In other embodiments, the SOT-MTJ structure may be formed before or at a same layer level as the respective transistors, which are all included in the disclosure.

The present disclosure may be further appreciated with the description of the following embodiments:

In a method embodiment, a first heavy metal layer is formed over a substrate. A first magnetic layer is formed adjacent to the first heavy metal layer. A first surface of the first magnetic layer interfaces a first surface of the first heavy metal layer. A magnetic tunnel junction structure is formed vertically adjacent to one or more of the first heavy metal layer or the first magnetic layer. The magnetic tunnel junction includes a reference layer, a tunneling barrier layer and a free layer.

In a structure embodiment, a structure includes a magnetic tunnel junction structure that includes a reference layer, a free layer and a tunneling barrier layer sandwiched between the reference layer and the free layer. A spin-orbit torque layer is vertically adjacent to the free layer of the magnetic tunnel junction structure. The spin-orbit torque layer includes a vertical stack of a first heavy metal layer and a first magnetic layer In a memory device embodiment, a memory device includes a substrate, a transistor over the substrate, and a magnetoresistive random access memory cell over the transistor. The transistor has a first source/drain terminal, a second source/drain terminal and a gate terminal. The magnetoresistive random access memory cell includes a magnetic tunnel junction structure and a spin-orbit torque structure vertically adjacent to the magnetic tunnel junction structure and coupled to a first source/drain terminal of the transistor. The spin-orbit torque structure includes a first heavy metal layer, and a first magnetic insertion layer interfacing with the first heavy metal layer.

What is claimed is:

1. A method, comprising:
   forming a first heavy metal layer over a substrate;
   forming a first magnetic layer adjacent to the first heavy metal layer, a first surface of the first magnetic layer interfacing a first surface of the first heavy metal layer;
   forming a second magnetic layer adjacent to the first heavy metal layer, a second surface of the second magnetic layer interfacing a second surface of the first heavy metal layer, the second surface of the first heavy metal layer being opposite to the first surface of the first heavy metal layer; and
   forming a magnetic tunnel junction structure vertically adjacent to one or more of the first heavy metal layer or the first magnetic layer, the magnetic tunnel junction including a reference layer, a tunneling barrier layer and a free layer,
   wherein a combined thickness of the first magnetic layer and the second magnetic layer is smaller than or equal to one third of a thickness of the free layer of the magnetic tunnel junction structure.

2. The method of claim 1, further comprising:
   forming a second heavy metal layer adjacent to the first magnetic layer, a second surface of the second heavy metal layer interfacing a second surface of the first magnetic layer, the second surface of the first magnetic layer opposing the first surface of the first magnetic layer.

3. The method of claim 1, wherein the first heavy metal layer and the first magnetic layer are laterally adjacent to one another.

4. The method of claim 1, wherein the first heavy metal layer and the first magnetic layer are vertically adjacent to one another.

5. The method of claim 1, wherein the first heavy metal layer is one or more of tungsten, platinum, or tantalum.

6. The method of claim 1, wherein the first magnetic layer is one of Co/Pt multilayer or Co/Ni multilayer, and has perpendicular magnetic anisotropy.

7. The method of claim 1, wherein the first magnetic layer is one of a CoFeB magnetic alloy or a NiFe magnetic alloy, and has in-plane magnetic anisotropy.

8. A method, comprising:
   forming a magnetic tunnel junction structure over a substrate, the magnetic tunnel junction structure including a reference layer, a free layer and a tunneling barrier layer sandwiched between the reference layer and the free layer; and
   forming a spin-orbit torque layer vertically adjacent to the free layer of the magnetic tunnel junction structure, the spin-orbit torque layer including a vertical stack of a first heavy metal layer and a first magnetic layer,
   wherein the forming the spin-orbit torque layer includes forming the first heavy metal layer and the first magnetic layer laterally adjacent to one another and at least one of the first heavy metal layer or the first magnetic layer interfaces with the free layer of the magnetic tunnel junction.

9. The method of claim 8, wherein the forming the spin-orbit torque layer includes forming the first magnetic layer that has a thickness smaller than or equal to one third of a thickness of the free layer of the magnetic tunnel junction structure.

10. The method of claim 8, wherein the forming the spin-orbit torque layer includes forming the first magnetic layer interfaces with the free layer.

11. The method of claim 10, further comprising forming a second magnetic layer on a surface of the spin-orbit torque layer that is opposite to the first magnetic layer.

12. The method of claim 8, wherein the forming the spin-orbit torque layer includes forming the first heavy metal layer that interfaces with the free layer.

13. The method of claim 12, further comprising forming a second heavy metal layer on a surface of the spin-orbit torque layer that is opposite to the first heavy metal layer.

14. The method of claim 8, wherein the forming the spin-orbit torque layer includes forming the first heavy metal layer on a first surface of the spin-orbit torque layer, and further comprising forming a magnetic layer is on a second surface of the spin-orbit torque layer that is opposite to the first surface of the spin-orbit torque layer.

15. A method, comprising:
   forming a transistor over a substrate, the transistor having a first source or drain terminal, a second source or drain terminal and a gate terminal; and
   forming a magnetoresistive random access memory cell over the transistor, the magnetoresistive random access memory cell including a magnetic tunnel junction structure and a spin-orbit torque structure vertically adjacent to the magnetic tunnel junction structure and coupled to a first source or drain terminal of the transistor, the spin-orbit torque structure including a first heavy metal layer and a first magnetic insertion layer interfacing with the first heavy metal layer laterally,
   wherein the forming the magnetoresistive random access memory cell includes forming the spin-orbit torque structure that includes a second magnetic insertion layer, the first magnetic insertion layer and the second magnetic insertion layer vertically interfacing with two opposing surfaces of the first heavy metal layer, respectively.

16. The method of claim 15, wherein the forming the magnetoresistive random access memory cell includes forming the magnetic tunnel junction structure that includes a reference layer, a free layer and a tunnel barrier layer sandwiched between the reference layer and the free layer, and wherein the free layer and the reference layer both include perpendicular anisotropy.

17. The method of claim 15, wherein the forming a magnetoresistive random access memory cell includes forming the first heavy metal layer of platinum and the first magnetic insertion layer of cobalt.

18. The method of claim 15, wherein the forming a magnetoresistive random access memory cell includes:
forming the first heavy metal layer that includes a comb shape having at least two tooth elements, and
forming the first magnetic insertion layer positioned between the two tooth elements of the first heavy metal layer.

19. The method of claim 15, wherein the forming the magnetoresistive random access memory cell includes forming the spin-orbit torque structure that includes a second heavy metal layer vertically interfacing with one of the first magnetic insertion layer and the second magnetic insertion layer.

20. The method of claim 15, wherein the first heavy metal layer is one or more of tungsten, platinum, or tantalum.

* * * * *